US005477133A

United States Patent [19]
Earle

[11] Patent Number: 5,477,133
[45] Date of Patent: Dec. 19, 1995

[54] DEVICE FOR MEASURING A WIDE RANGE OF VOLTAGES AND FOR DETERMINING CONTINUITY USING VISUAL AND TACTILE INDICATORS

[75] Inventor: Kent L. Earle, Woodridge, Ill.

[73] Assignee: Etcon Corporation, Burr Ridge, Ill.

[21] Appl. No.: 99,145

[22] Filed: Jul. 29, 1993

[51] Int. Cl.⁶ .................................................. G01R 31/02
[52] U.S. Cl. .................. 324/72.5; 324/542; 324/555; 324/133; 340/407.1; 439/482
[58] Field of Search .................................. 324/500, 539, 324/542, 555, 556, 713, 724, 72.5, 133, 149; 340/652, 660, 407.1; 439/482

[56] References Cited

U.S. PATENT DOCUMENTS

| | | | |
|---|---|---|---|
| 3,912,879 | 10/1975 | Lawson | 324/556 X |
| 4,004,223 | 1/1977 | Cohen | 324/72.5 X |
| 4,015,201 | 3/1977 | Chaffee | 324/556 |
| 4,027,236 | 5/1977 | Stewart | 324/556 |
| 4,225,817 | 9/1980 | Kahlden | 324/133 |
| 4,320,338 | 3/1982 | Morris et al. | 324/539 X |
| 4,356,442 | 10/1982 | Beha | 324/556 |
| 4,366,434 | 12/1982 | Ellis | 324/556 |
| 4,503,390 | 3/1985 | Wells | 324/133 |
| 4,550,287 | 10/1985 | Babcock | 324/133 |
| 4,791,376 | 12/1988 | Freedman et al. | 324/555 |
| 4,825,150 | 4/1989 | Sirasud | 324/133 |
| 4,859,932 | 8/1989 | Whitley | 324/72.5 |
| 5,285,163 | 2/1994 | Liotta | 324/539 X |

Primary Examiner—Kenneth A. Wieder
Assistant Examiner—Glenn W. Brown
Attorney, Agent, or Firm—Banner & Allegretti, Ltd.

[57] ABSTRACT

An electrical test device for use by an electrician in testing circuits. The device includes a voltage sensor, display, voltage transducer and steady current source. The voltage sensor measures the voltage between two conductors and provides a signal to the display, which responsively displays the voltage. The steady current source is in series with the voltage transducer, so that the voltage sensor may respond to a broad range of voltages while only a limited amount of current flows through the voltage transducer. Consequently, lower cost components may be used in the voltage transducer.

11 Claims, 4 Drawing Sheets

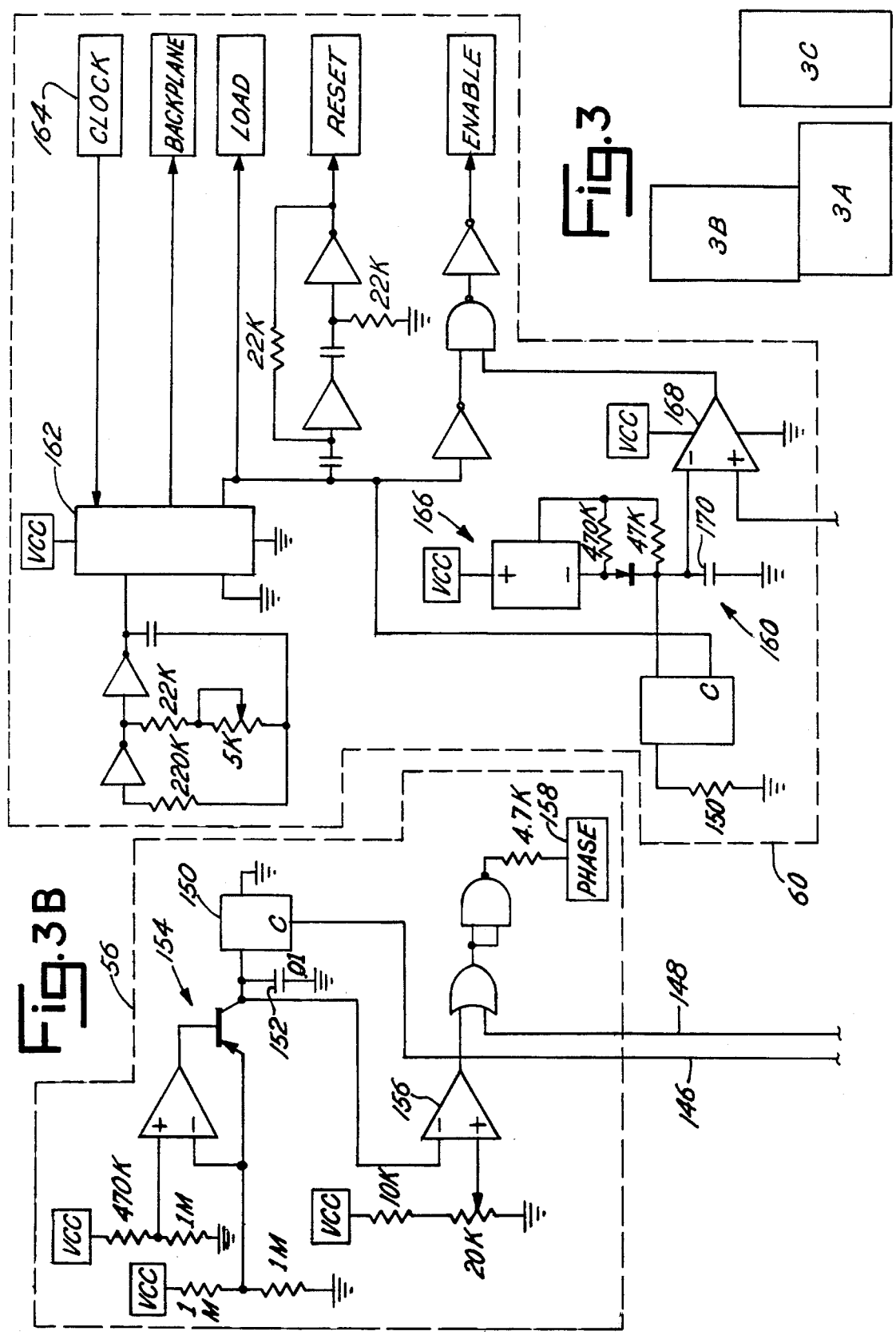

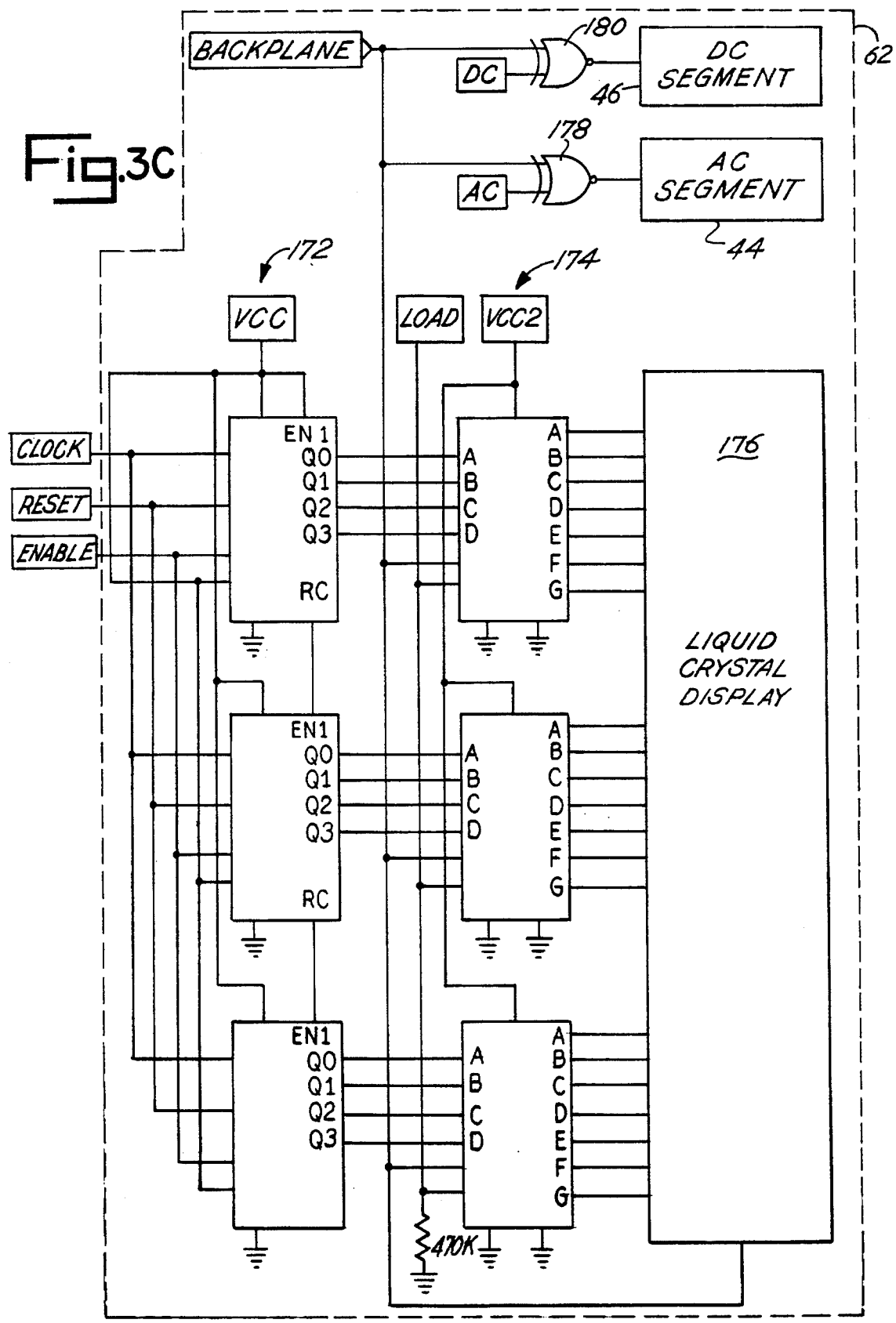

DEVICE FOR MEASURING A WIDE RANGE OF VOLTAGES AND FOR DETERMINING CONTINUITY USING VISUAL AND TACTILE INDICATORS

BACKGROUND OF THE INVENTION

The present invention relates generally to test devices and, more particularly, to a multi-function electrical test device. Often, when inspecting or testing electrical circuits in a building or home, an electrician or other technician must test the continuity of a wire (or other conductor) or test the voltage between two conductors. Such testing may need to be performed in low-light areas or where the electrician's hands are out of his or her line of sight. In such a case, the electrician may be unable to see a visual representation on the test device regarding the continuity of an electrical conductor or the voltage between two conductors.

Electricians also perform tests in cramped areas or under conditions where both of the electrician's hands are occupied. Accordingly, the electrician may find it inconvenient to activate buttons on the test device.

Further, electricians may be called upon to measure a wide range of voltages between two conductors. The electrician may also find it inconvenient to use different testing devices in order to accurately measure different voltage ranges.

Unfortunately, many of the presently available test devices are poorly suited to meeting such needs of an electrician. Electrical test equipment often gives only visually perceptible information or requires manual inputs from the electrician operating the equipment. Further, many of the available testers may not measure a sufficiently wide range of voltages or are cumbersome, heavy, and expensive.

SUMMARY OF THE INVENTION

In a principal aspect, the present invention is an electrical testing device. The apparatus includes a voltage measuring circuit and a display, as well as a steady current source in series with the voltage sensor or transducer. In this way, the voltage sensor may detect wide range of voltages while using components that are adapted for low power levels.

The testing device also may include a substantially independent continuity tester. Accordingly, the operation of the voltage measuring circuit will not affect the ability of the user to test the continuity of the conductor.

Yet a further aspect of the invention includes a voltage sensing circuit that includes an alternating and direct voltage sensor. Such a sensor detects whether the voltage of the circuit is either alternating or direct and, consequently, enables the voltage measuring circuit to detect either an alternating or direct voltage and provide the appropriate signal to the display.

Thus, an object of the present invention is an improved voltage testing device. Still a further object is a voltage sensor that may respond to a wider range of voltages between two conductors, while still using components that have limited power handling capabilities and are less expensive. Still a further object is a testing device that requires fewer manual inputs, that provides more information with both visual and non-visual outputs, and that is easier to use. These and other objects, features, and advantages of the present invention are discussed or apparent in the following detailed description.

BRIEF DESCRIPTION OF THE DRAWINGS

A preferred embodiment of the present invention is described herein with reference to the drawings wherein:

FIGS. 3, 3A, 3B, and 3C are a circuit diagram of the preferred embodiment shown in FIG. 2.

DETAILED DESCRIPTION OF THE PREFERRED EMBODIMENT

Figure 1:
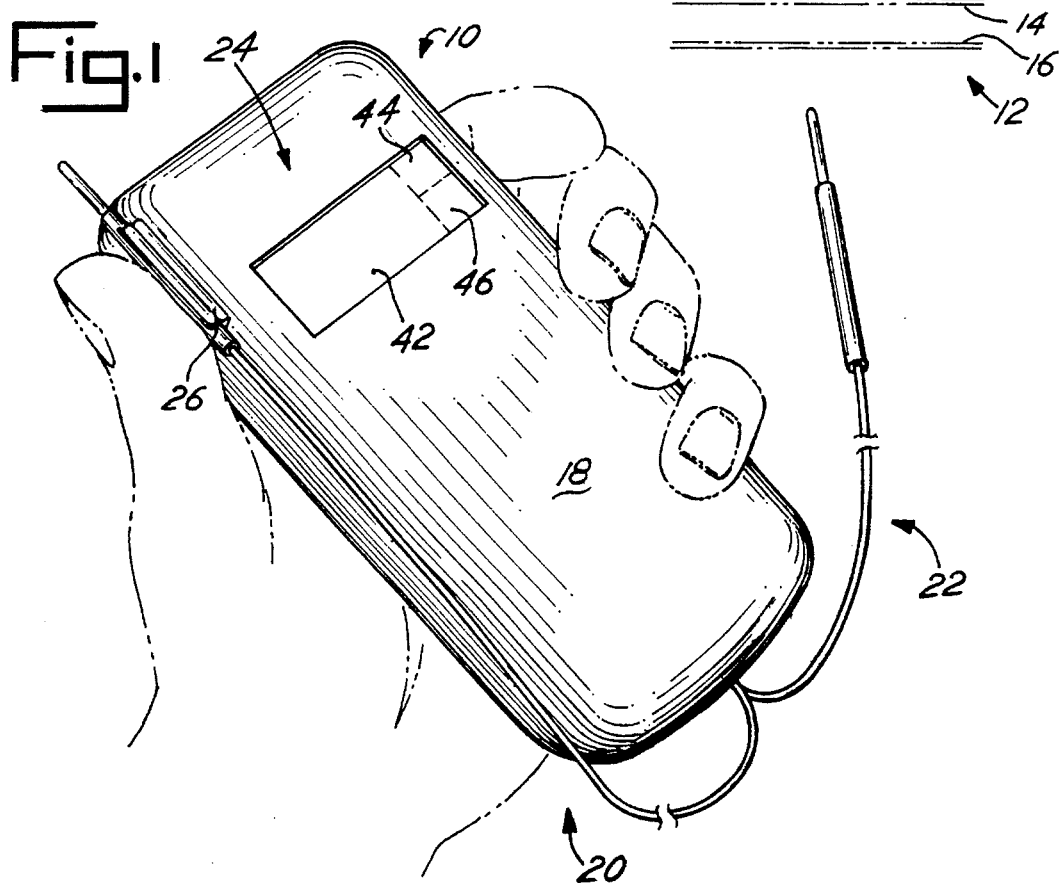
FIG. 1 is an isometric view of a preferred embodiment of the present invention being held by a technician.
Figure 2:
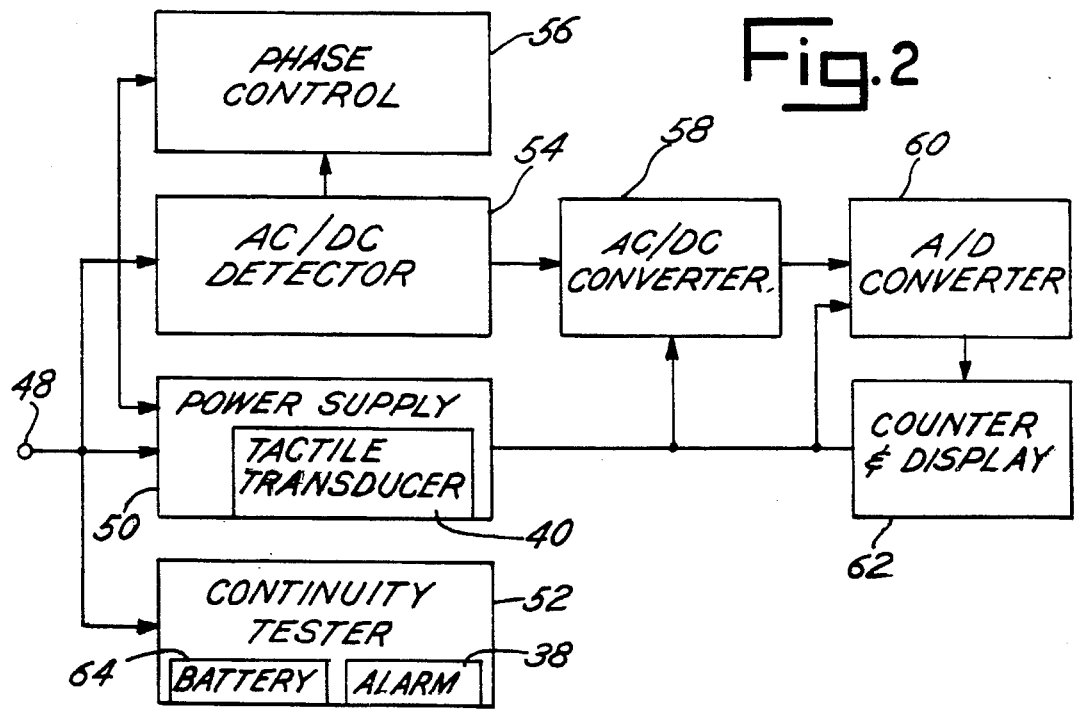
FIG. 2 is a block diagram of the preferred embodiment shown in FIG. 1.

Referring to FIGS. 1–3, a preferred embodiment of the present invention is shown as a tester 10. The tester 10 measures the conditions of an electrical conductor 12 having first and second wires 14, 16.

As shown in FIG. 1, the tester 10 includes an outer case 18, positive and negative test leads 20, 22, and a display 24. The case 18 is comprised of plastic and molded to fit within the palm of a user's hand (shown in phantom lines). The case 18 further includes at least one lead holder 26 for engaging and disengaging the leads 20, 22. In this way, both the case 18 and one of the leads 20, 22 may be held conveniently in one hand of the user while another of the leads 20, 22 may be held in the other hand of the user of the device 10. The tester 10 includes no external buttons or other manual input devices.

The tester 10 sets forth a voltage reading on the display 24. The tester 10 also activates an internal acoustic alarm or transducer 38 when the leads 20, 22 have a substantially continuous (low resistance) current path between them. The tester 10 also activates an internal, vibrating tactile transducer 40 when the leads 20, 22 are interconnected to an alternating (AC) voltage. See FIGS. 1 and 2.

As shown in FIG. 1, the display includes a primary section 42, to display a numerical representation of the voltage measured between the leads 20, 22, and first and second secondary display segments 44, 46 to show whether the voltage between the leads 20, 22 is an alternating (AC) or direct (DC) voltage.

FIG. 2 exhibits the main functional feature blocks of the present invention. The tester 10 includes an input 48, which is interconnected to a power supply 50, a continuity tester 52, and an alternating current/direct current (AC/DC) detector 54. The power supply 50 is also interconnected to a phase control 56 as well as an AC/DC converter 58, an analog to digital (A/D) converter 60, and a counter and display 62.

The power supply 50 includes the tactile transducer 40, which allows the case 18 to vibrate when the leads 20, 22 are interconnected to an alternating voltage source. The power supply 50 includes no independent power source. Rather, it takes power to operate from the wires 14, 16. The power supply 50 provides a regulated power to the phase control 56, AC/DC converter 58, A/D converter 60, and counter and display 62.

The continuity tester 52 is substantially electrically independent of the other blocks of the tester 10. The alarm 38 of the continuity tester 52 provides an audible sound if there is substantial electrical continuity between the leads 20, 22 of the tester 10. A battery 64 powers the continuity tester 10. Thus, even if all other blocks of the tester 10 fail, the continuity tester 52 will continue to provide a signal when continuity is sensed.

The AC/DC detector 54 (or voltage type sensor) detects whether the voltage at the leads 20, 22 is an alternating or direct voltage. When the voltage monitored is alternating, the detector 54 provides an alternating voltage signal to the phase control 56. The phase control 56 monitors the alternating power supplied by the power supply 50. During a preselected phase, or segment, of such voltage (such as, for example, between 165° to 180° of a 360° cycle), the phase control 56 provides a phase control signal to the power supply 50. The power supply 50, in turn, only periodically activates the tactile transducer 40 (such as, for example, between 165° to 180° of a 360° cycle). Thus, a lower power (and lower cost) tactile transducer 40 may be used to indicate the existence of an alternating current voltage.

Upon sensing the voltage at the leads 20, 22, the AC/DC detector provides an alternating or direct signal to the AC/DC converter 58, which, in turn, advises the A/D converter 60 of the nature of the sensed voltage. The A/D converter 60 provides a digital signal, representative of the analog voltage supplied at the leads 20, 22, to the counter and display 62. Thus, the counter and display 62 cooperates with the A/D converter 60 to measure the voltage and set forth a representation of the voltage.

As shown in the detailed circuit diagram of FIG. A–C, the preferred embodiment of the present invention uses readily available components, which are obtainable from a larger variety of vendors. Accordingly, the tester 10 may substantially be manufactured without relying on a "single source" for any one component. Further, the components are generally adapted for lower power applications, thus reducing overall the cost of the tester 10.

The power supply 50 is interconnected to the positive and negative leads 20, 22 and includes a full wave rectifier 66, the tactile transducer 40, a steady, or substantially constant, current source 68, and a voltage hold circuit 70. The rectifier 66 includes four diodes 71, 72, 73, 74 to provide a fully rectified signal when the leads 20, 22 are interattached to an AC voltage signal. The rectifier 66 also includes first and second light emitting diodes (LEDs) 76, 78 that are in series with the steady current source 68.

The first light emitting diode 76 is interconnected to the positive lead 20, and the second light emitting diode 78 interconnected to the negative lead 22. Accordingly, when the positive lead 20 is interconnected to a positive, direct voltage source, and the negative lead 22 is interconnected to ground, only the first LED 76 will illuminate. Conversely, if the negative wire is interconnected to a positive, direct voltage source, and the positive lead 22 is interconnected to ground, the second LED 78 will illuminate. If an AC voltage signal is detected, both the first and second LEDs 76, 78 will illuminate. Because the LEDs 76, 78 are in series with the steady current source 68, the illumination and power dissipation of the LEDs is substantially constant, regardless of the voltage applied between the leads 20, 22.

The tactile transducer 40 is in series with the steady current source 68 (or current limiting circuit) such that a lower-power transducer may be used. The transducer 40 includes a lower power (e.g. 12 volt) coil 80 and a magnet 82 attached to the case 18 of the tester 10. Since the magnet 82 increases the flux of the field created by the coil 80, the magnet 82 helps to allow a smaller relay to be used to vibrate the case 18 of the tester 10.

When a current is supplied through the coil 80, the magnet 82 and the attached case 18 are pulled in by the coil 80. When the leads 20, 22 momentarily stop exhibiting a voltage, the coil 80 stops pulling on the magnet 82, and the elasticity of the case 18 moves the magnet 82 and case away from the coil 80. When the leads 20, 22 are again at different voltages, the coil 80 again pulls the magnet 82 to vibrate the case.

The rectifier 66 provides a full wave voltage signal to the A/D converter along a rectified line 84. The steady current source 68 comprises first and second field effect transistors 86, 88 in series, as well as a zener diode 90, first and second current limiting resistors 92, 94, and a phase-controlled transistor 96. The second transistor 88 has a drain 100, gate 104, and a source 108. Since the transistors 86, 88 are in series, each of the transistors 86, 88 need only bear approximately one-half the voltage applied between the positive and negative leads 20, 22 of the tester 10. Accordingly, lower-cost transistors may be used.

The zener diode 90 is interconnected, in a parallel relationship, with both the gate 104 and source 108 of the second transistor 88 as well as the resistors 92, 94 and phase-controlled transistor 96. Thus, when current is flowing through the transistors 86, 88, the zener diode 90 holds the voltage from the gate 104 to ground to approximately nine volts. The voltage between the gate 104 and source 108 of the second transistor 88 is approximately three volts. Accordingly, the voltage between the source 108 and ground is approximately six volts when the tester 10 is in operation.

With the transistor 96 off, representing a substantially open circuit, current flows through the first and second resistors 92, 94 to ground, as well as charging the voltage hold circuit 70. Thus, current is limited to no more than several milliamps. When the transistor 96 receives a phase enable signal, it briefly turns on, however, and the current, for a relatively brief period of time, is limited to no more than several hundred milliamps. In the preferred embodiment, for example, the current ranges from approximately 110 milliamps (with the transistor 96 on) to approximately 0.3 milliamps (with the transistor 96 off).

The phase enable signal that turns on the transistor 96 continues for only a predetermined phase, or segment, of the each cycle of an alternating voltage signal applied to the leads 20, 22. In the preferred embodiment, this phase occurs approximately between the 165° and 180° of each 360° alternating voltage cycle applied to the leads 20, 22. Longer segments, up to, for example, 45°, or shorter segments, down to, for example, 5°, could also be employed.

The voltage hold circuit 70 maintains a substantially constant voltage source for other elements of the tester 10. The voltage hold circuit 70 is a 6-volt power source, regardless of the action of the transistor 96. The voltage hold circuit 70 will continue to power the counter and display and counter 62, for example, both between phase enable signals as well as when the leads 20, 22 have be removed from the wires 14, 16. The display and counter 62 may continue to display a voltage reading until the leads 20, 22 are again applied to wires having a substantial voltage between them or the hold circuit 70 becomes discharged (after, for example, 15 or 20 minutes).

The AC/DC detector 54 is connected to the leads 20, 22 and includes first and second OR gates, 110, 112, first and second NAND gates 114, 116, a DC line 118, an AC line 120, and first and second capacitors 122, 124. The gates 110, 112 provide a "neater," more abrupt, square wave-signal for use by the phase control 56 and the rest of the tester 10. If the second lead 22 is interconnected to ground and the first lead 20 is interconnected to a positive DC voltage, the DC line 118 will provide a positive DC voltage (and the DC segment 46 of the display 24 will set forth a designation of a direct voltage). If the first and second capacitors 122, 124 are each being charged when the first and second leads 20, 22 alternatively become positive with respect to each other, the AC line 20 will supply a positive signal to display (and the AC segment 44 of the display 24 will set forth a designation of an alternating voltage).

The AC/DC converter 58 includes first and second electronic switches 126, 128, a voltage compensation circuit 130, a timing capacitor 32, a differential amplifier 134, and a converter output line 136. The amplifier 134 has first and second inputs 138, 140. The second input 140 is interconnected to an input resistor 144. When a positive signal is provided on the AC line 120, the first switch 126 is closed, and the second switch 128 is open. The second input 140 to the amplifier 134 is the output voltage, as reduced by the "I-R drop" across the resistor 144. The voltage on the rectified line 84 is supplied to the first input 138 of the amplifier 134. The compensation circuit 130 raises the voltage supplied to the first input 138 of the amplifier 134, to compensate for the diode voltage drops occurring within the rectifier 66.

With a DC voltage applied to the leads 20, 22, and, thus, a positive signal on the DC line 118 and a negative signal on the AC line 120, the first input 138 corresponds to the DC voltage on the rectified line 84, the first switch 126 is open, and the second switch 128 is closed. The relatively low voltage of the capacitor 132 is applied to the second input 140 of the amplifier (as lowered by the "I-R drop" across the resistor 143). Accordingly, the capacitor 132 is more quickly charged.

Figure 3A:
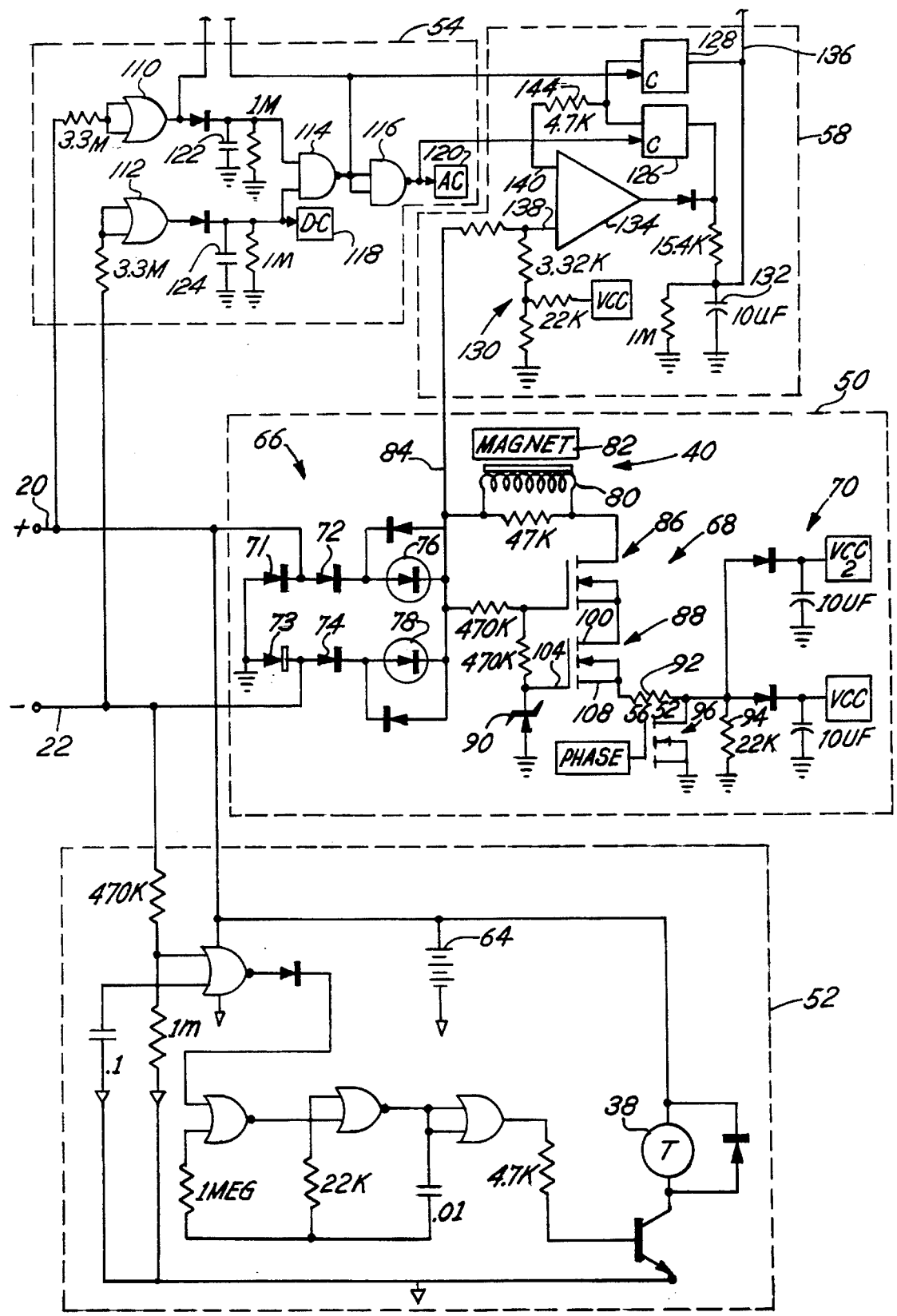

When the amplifier 134 initially begins providing an output, the capacitor 132 begins charging. The capacitor 132 provides a steadily increasing voltage signal, along the converter output line 136, to the A/D converter 60. Referring to FIG. 3A, the capacitor 132 (10 microfarads) acts like a filter, but the voltage across it is determined by the ratio of the 15.4 kilohm resistor and the 1 megohm resistor in parallel with the 10 microfarad capacitor 132.

As shown in FIG. 3B, the phase control 56 includes first and second input lines 146, 148, an electronic switch 150, a phase capacitor 152, a charging amplifier 154, a comparator 156, and a phase signal lead 158. The phase control 56 receives a signal from the AC/DC detector 54, along the lead 146, that corresponds to the voltage on the first lead 20. The signal for an AC voltage is a square wave representing beginning at every cycle of the AC input. The switch 150 thus periodically allows the phase capacitor 152 to be charged by the charging amplifier 154. When the capacitor 152 achieves a sufficient charge, the comparator 156 changes state and, if supplied with a low signal on the line 148 (indicating an AC input) the phase control 56 will then provide a phase signal, along the phase lead 158, to the power supply 50.

The phase signal may occur, for example, during a predetermined segment of the AC input voltage cycle shortly before the 180° phase of the positive lead 20. Only during this brief interval is the phase-controlled transistor 96 turned on. Thus, the duty cycle of the coil 80 is reduced, allowing a lower-cost coil to be used.

Like the voltage on the capacitor 132, the voltage build up on the capacitor 152 is substantially constant, using a standard ramp and pedestal technique. The time that the capacitor 152 requires to charge may be timed with a reasonable degree of accuracy, so that it reaches a specific charge adequate to change the state of the comparator 156 when the phase of the input voltage is at 165°.

As shown in FIG. 3B, the A/D converter 60 includes a ramp and pedestal circuit 160, 12-stage binary counter 162, clock 164, temperature compensated constant current source circuit 166, and comparator 168. The ramp and pedestal circuit 160 includes a capacitor 170 that charges at a constant rate. As shown in FIG. 3C, the counter and display 62 includes a digital counter 172 (comprised of three 74HC160 integrated circuits), a display driver 176 (comprised of three MC14543B integrated circuits), and a liquid crystal display 178, as well as AC and DC drivers 178, 180.

The clock 164 supplies pulses to the binary counter 162, which provides timing signals for the operation of the tester 10, including the backplane lighting for the display 24, an enable signal for the digital counter 172, and a load signal for the display driver 174. The temperature compensation circuit 166 provides a substantially constant current source to the capacitor 170, and, thus, a stable base for comparison by the comparator 168.

The counter 172 effectively times the interval for the comparator 168 to change state (and, thus, the time for the capacitor 132 to charge) indicating the voltage being supplied to the leads 20, 22. Thus, when the charge on the capacitor 132 is large enough and the comparator 168 changes state, the count stops.

Upon receiving a load signal, the stopped count, representing a voltage in digits, is loaded into the liquid crystal display 176. The AC and DC drivers 178, 180 drive the AC and DC segments 44, 46 of the display 24.

As shown in FIG. 3A the continuity detector 52 is substantially electrically independent from the rest of the tester 10. It includes it own power source, in the form of a 4.5 volt battery 64, as well as the audible alarm or transducer 38. If a substantially closed circuit is detected between the leads 20, 22, the transducer 38 is powered by the battery 64, through the circuit, to give off a sound. If a large alternating voltage in the circuit should power the transducer 38 (in addition to the battery 182), the transducer 184 is only cyclically activated and produces a warbling tone.

A preferred embodiment of the present invention has been described herein. It is to be understood, of course, that changes and modifications may be made in the preferred embodiment without departing from the true scope and spirit of the present invention, as defined by the appended claims.

I claim:

1. A testing device for electrical conductors, wherein a voltage exists between said conductors, comprising, in combination:

a voltage sensor for measuring said voltage between said conductors and responsively providing a voltage signal representing said voltage between said conductors;

a display for receiving said voltage signal from said voltage sensor and responsively displaying a visual representation of said voltage between said conductors;

a tactile transducer between said conductors for activating in response to said voltage between said conductors; and a substantially steady current source in series with said tactile transducer for limiting current through said tactile transducer.

2. A testing device as claimed in claim 1 wherein said tactile transducer vibrates in response to said voltage between said conductors.

3. A testing devices as claimed in claim 2 wherein said voltage is an alternating voltage defining a voltage frequency and wherein said tactile transducer vibrates substantially at a frequency related to said voltage frequency.

4. A testing device as claimed in claim 3 wherein said steady current source limits current through said tactile transducer to less than 200 milliamps.

5. A testing device as claimed in claim 4 wherein said steady current source comprises at least first and second transistors in a series relationship, whereby each of said transistors need only bear a portion of said voltage between said conductors.

6. A testing device as claimed in claim 5 wherein said transistors are field effect transistors, each having a gate and drain, and wherein said current source further comprises a current limiting resistor, connected to a drain of one of said field effect transistors, and a zenor diode, interconnected to a gate of said one of said field effect transistors, said zenor diode and resistor being in a parallel configuration.

7. A testing device as claimed in claim 5 further comprising a case substantially encompassing said voltage sensor, transducer, and steady current source, and wherein said tactile transducer comprises a coil in series with said steady current source and a magnet fixedly attached to said case, substantially adjacent said coil, whereby said magnet and case vibrate at a frequency substantially related to said frequency of said alternating voltage of said conductors.

8. A testing device as claimed in claim 1 further comprising a continuity tester for determining whether a low resistance electrical path exists between said electrical conductors, said continuity tester including a separate power supply and a separate alarm to indicate continuity between said conductors, said continuity tester being substantially electrically independent of said voltage sensor, display, tactile transducer, and steady current source.

9. A testing device as claimed in claim 8 wherein said separate alarm comprises a transducer for emitting a sound when continuity .is between said electrical conductors is detected.

10. A testing device as claimed in claim 1 wherein said conductors exhibit an alternating voltage with substantially repetitive phases and said testing device further comprises a phase control for monitoring said alternating voltage and providing a phase enable signal for a predetermined segment of said phases of said alternating voltage and wherein said voltage sensor is interconnected to said phase control and measures said voltage between said conductors upon receiving said phase enable signal.

11. A testing device as claimed in claim 10 wherein said repetitive phases of said alternating voltage vary between 0° and 360° and said predetermined segment of said phases is less than 45°.

\* \* \* \* \*